United States Patent [19]
Kim et al.

[11] Patent Number: 5,354,713
[45] Date of Patent: Oct. 11, 1994

[54] CONTACT MANUFACTURING METHOD OF A MULTI-LAYERED METAL LINE STRUCTURE

[75] Inventors: Jae Kap Kim; Gon Son, both of Kyoungki-do, Rep. of Korea

[73] Assignee: Hyundai Electronics Industries Co., Ltd., Kyoungki-do, Rep. of Korea

[21] Appl. No.: 983,875

[22] Filed: Dec. 1, 1992

[30] Foreign Application Priority Data

Dec. 2, 1991 [KR] Rep. of Korea .................. 91-21955

[51] Int. Cl.$^5$ ............................................. H01L 21/44
[52] U.S. Cl. ................................... 437/195; 437/231; 437/235; 148/DIG. 50
[58] Field of Search ............... 437/195, 235, 231, 981; 148/DIG. 50, DIG. 51

[56] References Cited

U.S. PATENT DOCUMENTS 4,965,226 10/1990 Gootzer et al. .
4,984,055 1/1991 Okumura et al. .

FOREIGN PATENT DOCUMENTS 4162626 6/1992 Japan .

*Primary Examiner*—Olik Chaudhuri
*Assistant Examiner*—C. Everhart
*Attorney, Agent, or Firm*—Merchant, Gould, Smith, Edell, Welter & Schmidt

[57] ABSTRACT

The present invention relates to a manufacturing method of a contact of a multi-layered metal line of a highly integrated semiconductor device.

The insulating layer between the metal lines is flattened and step coverage is improved by using a SOG layer or polyimide.

5 Claims, 4 Drawing Sheets

CONTACT MANUFACTURING METHOD OF A MULTI-LAYERED METAL LINE STRUCTURE

BACKGROUND OF THE INVENTION

The present invention relates to a method for manufacturing a contact of a multi-layered metal line structure of a highly integrated semiconductor device and more particularly to a contact manufacturing method of a multi-layered metal line structure that improves step coverage by flattening the insulating layer between metal lines using spin on glass (SOG) or polyimide.

The multi-layered metal line structure is used to achieve a high integration of a semiconductor device. However, if this structure is used, a serious topology effect occurs.

The conventional method of manufacturing a contact is carried out by the following processes: SOG or polyimide layer is formed on top of the insulating layer located between the lower and upper metal lines for flattening. The etching selectivity between the SOG layer and the insulating layer located on the bottom of SOG layer is determined first and then SOG layer is etched back to a predetermined thickness for flattening (at this time, a thick SOG layer is formed over part of the lower metal line with low a topology and a thin SOG layer is formed over part with a high topology). Next, an insulating layer with a pre-determined thickness is formed on top of the flattened SOG layer. Then, several contact holes are formed by removing predetermined portions of the insulating layer on the lower metal line. At this time, since depths of contact holes are different, the lower metal line with high topology remains exposed to the etching process of the insulating layer until the lower metal line with low topology is exposed, thus damaging the surface of the metal line with high topology. Also, reliability of the semiconductor device is reduced because of a bad step coverage when the lower metal line with deep contact hole is contacted with the upper metal line.

SUMMARY OF THE INVENTION

Accordingly, the object of the present invention is to provide a contact manufacturing method of a multi-layered metal line of a semiconductor device used to avoid the previously mentioned problems.

In accordance with the present invention, the above and other objects and advantages are provided by a method comprising the steps of:

forming a first conductive layer pattern on a silicon substrate;

forming an insulating layer on top of said first conductive layer pattern;

forming a second conductive layer pattern on top of said insulating layer;

forming a first interlayer insulation over the top of said second conductive layer pattern and then coating a SOG layer smoothly over that part;

forming a photoresist pattern with the predetermined part removed over the top of said SOG layer and then isotropically etching the SOG layer to expose the first interlayer insulation located on top of said second conductive layer pattern;

removing said photoresist pattern;

forming a second interlayer insulation uniformly over the top of the entire structure; and dry etching said second interlayer insulation and first interlayer insulation located on the predetermined contact area to expose the second conductive layer pattern so as to form a first contact hole and a second contact hole which do not have topology difference and then to form a third conductive layer over its top.

DETAILED DESCRIPTION OF THE DRAWINGS

Figure 1A:
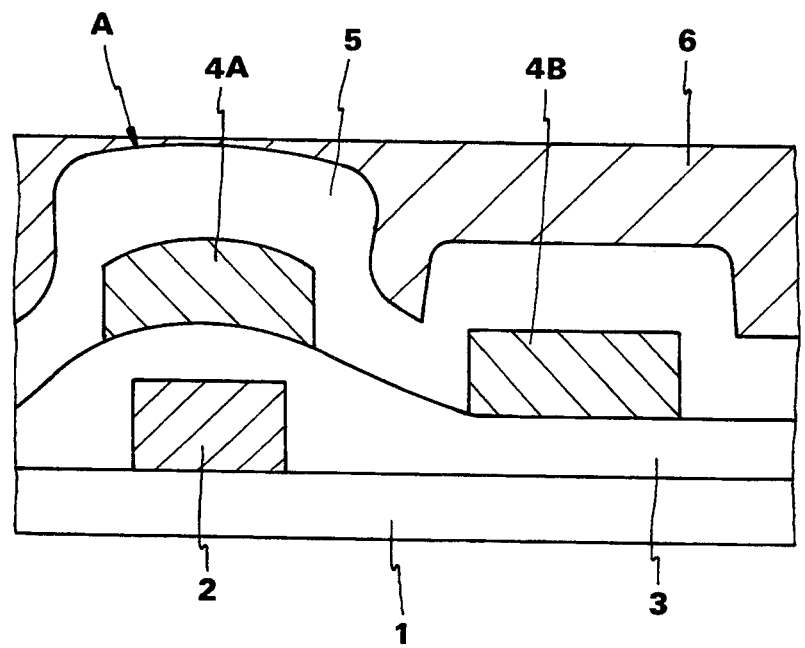
FIG. 1A through FIG. 1C are cross-sectional views that illustrate contact manufacturing processes of a multi-layered metal line structure using the conventional method.

Now, the present invention will be explained in detail by referring to the drawings.

Figure 1B:
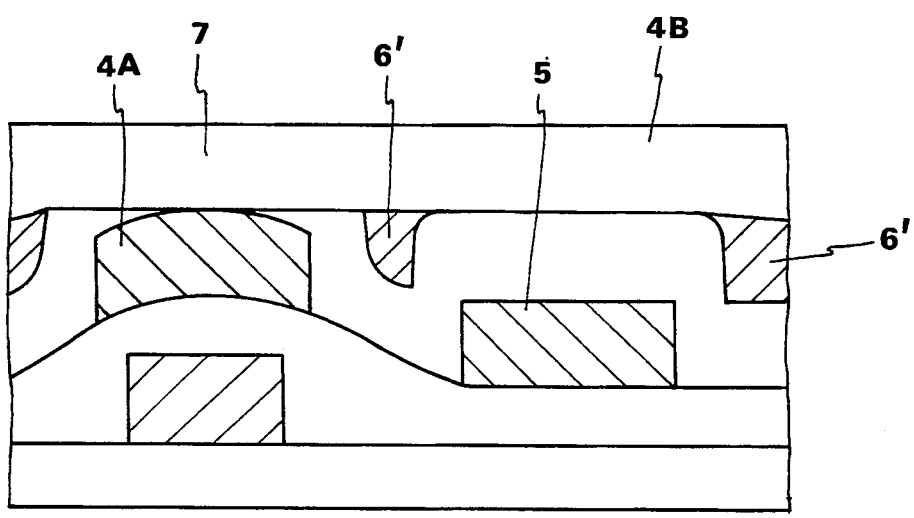
Figure 1C:
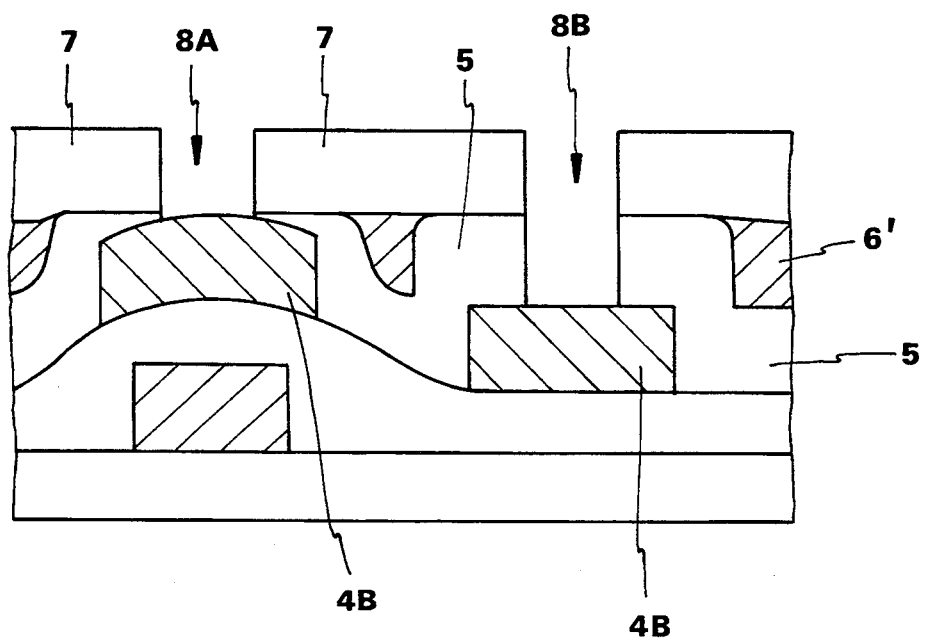

FIG. 1A through FIG. 1C are cross-sectional views that illustrate a conventional contact manufacturing method of a multi-layered metal line.

As illustrated in FIG. 1A, a first conductive layer pattern 2 (for example, gate electrode) is formed on a silicon substrate 1 (or on an insulating layer). Then, an insulating layer 3 is formed on the entire upper structure. Then, second conductive layer patterns 4A, and 4B are formed on top of the insulating layer 3 above the first conductive layer pattern 2 and silicon substrate 1. Then, a first interlayer insulation 5 having a predetermined thickness is formed and then SOG or polyimide layer 6 is formed flatly on its top in such a way that SOG layer is thicker (for example, 500 Å) than the highest part (A) of the surface of the surface of the first interlayer insulation 5.

Referring to FIG. 1B, up to top surface of a second conductive layer pattern 4A is etched backed flatly after determining the etching selectivity between said SOG layer 6 and first interlayer insulation 5 and as a result, SOG layer 6 will remain only on the recess 6' located on upper surface of the first interlayer insulation 5. Following this, a second interlayer insulation 7 having a predetermined thickness is formed.

FIG. 1C is a cross-sectional view illustrating the following processes; the first interlayer insulation 5 and the second interlayer insulation 7 of the contact area located on top of the second conductive layer patterns 4A and 4B are etched to form a first contact hole 8A and a second contact hole 8B respectively.

It should be noted here that the second conductive layer pattern 4B located under the second contact hole 8B could be exposed by a continuous etching process even after the surface of the second conductive layer pattern 4A located under the first contact hole 8A is exposed since the depth of the first contact hole 8A is shallow and the depth of the second contact hole 8B is deep while forming said first and second contact holes 8A and 8B. Accordingly, the top surface of the second conductive layer pattern 4A under the first contact hole 8A having a shallow depth is damaged because it is over-exposed to the etching process. Also, when forming the third conductive layer (not illustrated) over the top of the second interlayer insulation 7 and making it contact with the second conductive layer patterns 4A and 4B of the lower part, bad step coverage occurs because of a large topology difference between the first and second contact holes 8A and 8B.

FIG. 2A through FIG. 2D are cross-sectional views illustrating an embodiment of the present invention.

Figure 2A:
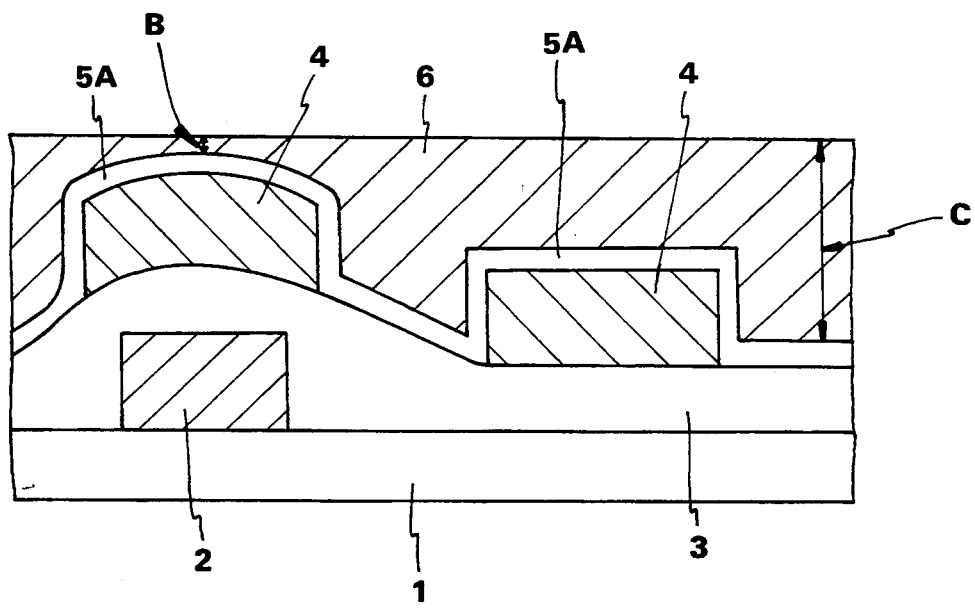
FIG. 2A through FIG. 2D are cross-sectional views that illustrate contact manufacturing processes of a multi-layered metal line structure in accordance with the present invention.

As illustrated in FIG. 2A, the first conductive layer pattern 2, insulating layer 3, and the second conductive layer patterns 4A and 4B are respectively formed on the silicon substrate or insulating layer 1 using the same method as in FIG. 1A and then the SOG or ployimide layer 6 is formed flatly after forming the first interlayer insulation 5A over the entire structure already formed. Here, the thickness of the SOG layer 6 is about 500 Å for part a with high topology (B) and about 4000 Å for part with a low topology (C).

Figure 2B:
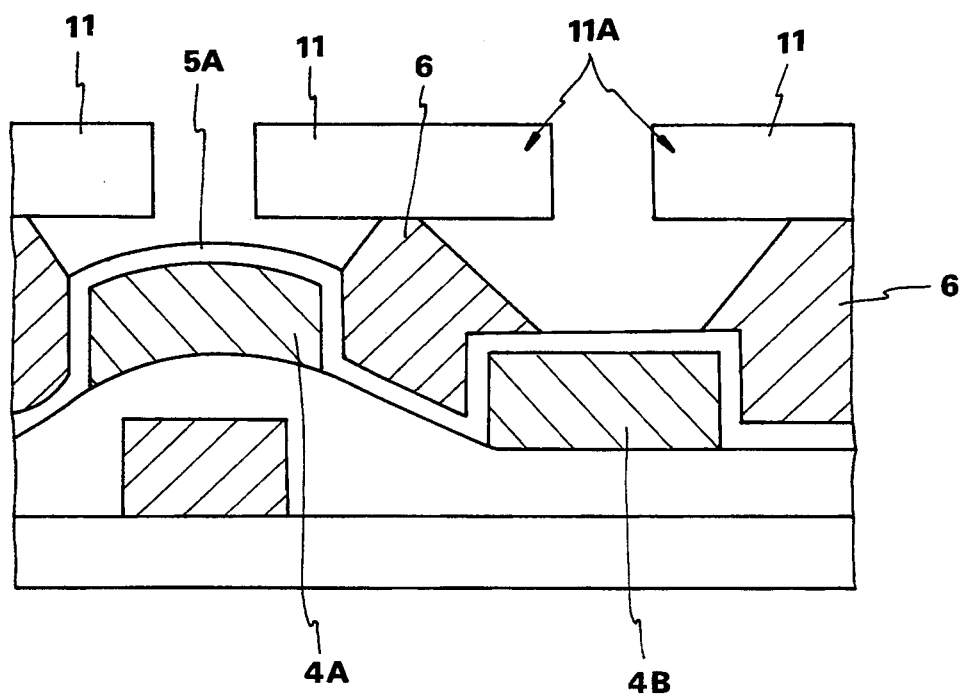

FIG. 2B is a cross-sectional view illustrating the following processes; after carrying out the processes depicted in FIG. 2A, the photoresist layer 11 is coated and a photoresist pattern 11A is formed using a contact mask; then, the SOG layer 6 that has been exposed is removed by an isotropic etching process. The etching selectivity ratio between the SOG layer 6 and the first interlayer insulation 5A should be 10:1 when isotropically etching the SOG layer 6 and the dry etching or wet etching with HF can be performed.

Figure 2C:
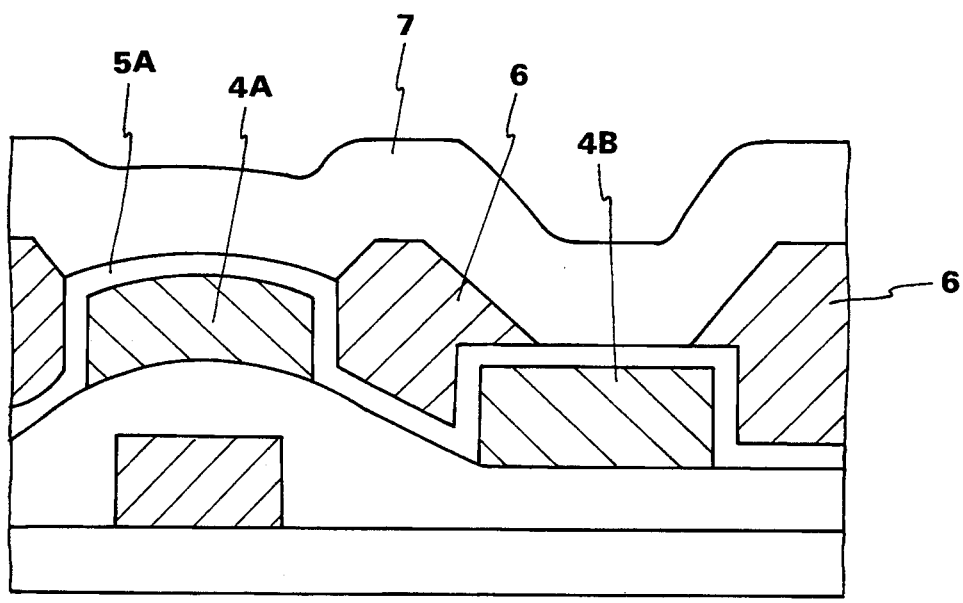

FIG. 2C is a cross-sectional view that illustrates the formation of the second interlayer insulation 7 having a predetermined uniform thickness over the top of the entire structure after removing the photoresist pattern 11A depicted in FIG. 2B. As shown in the drawing, the second interlayer insulation 7 located on top of the second conductive layer pattern 4B is formed in such a way that it is slightly slanted.

Figure 2D:
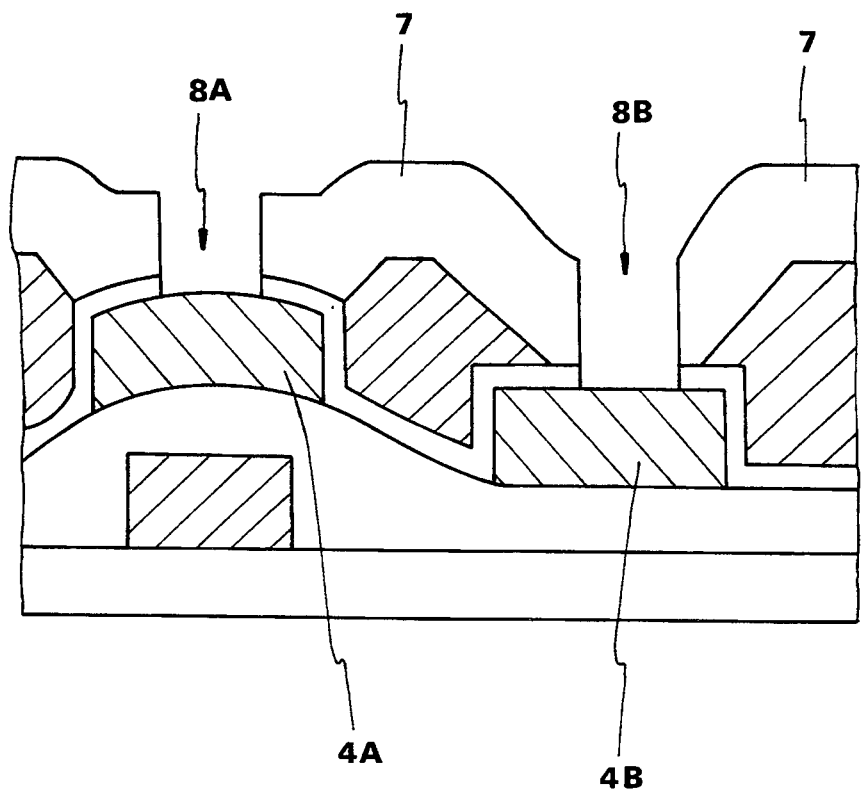

Next, as shown in FIG. 2D, the second interlayer insulation and the first interlayer insulation 5A of the predetermined contact area are dry etched using the photoresist pattern used for contact (not illustrated) and then the first contact hole 8A and the second contact hole 8B having the exposed second conductive layer patterns 4A and 4B are formed, respectively.

According to the present invention, the exposed time for etching process for the second conductive layer patterns 4A and 4B of the lower part are identical because the depths of the contact wall of the first contact hole 8A and the second contact hole 8B are the same. Also, the damage on the second conductive layer pattern 4A can be prevented since the etching process time is drastically reduced. Finally, because the second interlayer insulation 7 where the second contact hole 8B is formed is slightly slanted, step coverage of the third conductive layer (not illustrated) formed over it can be improved.

What is claimed is:

1. A method for manufacturing a contact of a multi-layered metal line of a semiconductor device comprising the steps of:

forming a first conductive layer pattern on a silicon substrate;

forming an insulating layer on top of said first conductive layer pattern;

forming a second conductive layer pattern on top of said insulating layer;

forming a first interlayer insulation over the top of said second conductive layer pattern and then coating a layer smoothly over that part, said coating layer selected from an SOG layer and a polyimide layer;

forming a photoresist pattern over the top of said SOG or polyimide layer and then isotropically etching the SOG or polyimide layer to expose the first interlayer insulation located on top of said second conductive layer pattern;

removing said photoresist pattern;

forming a second interlayer insulation uniformly over the top of the entire structure; and dry etching said second interlayer insulation and first interlayer insulation located on the contact area to expose the second conductive layer pattern so as to form a first contact hole and a second contact hole which do not have topology difference and then to form a third conductive layer over its top.

2. The method according to claim 1, wherein a polyimide instead of the SOG layer is formed over the top of said first interlayer insulation.

3. The method according to claim 1, wherein the thickness of said SOG layer is 500 Å for part with a high topology and 4000 Å for part with a low topology.

4. The method according to claim 1, wherein an etching selectivity ratio of said SOG layer and the first insulating layer is 10:1.

5. The method according to claim 1, wherein said SOG layer is removed using a wet etching process with HF.

* * * * *